United States Patent
Han et al.

(10) Patent No.: US 8,723,597 B2
(45) Date of Patent: May 13, 2014

(54) SWITCHED CAPACITOR CIRCUIT

(75) Inventors: Gunhee Han, Seoul (KR); Youngcheol Chae, Seoul (KR); Inhee Lee, Seoul (KR); Dongmyung Lee, Seoul (KR); Seunghyun Lim, Seoul (KR); Ji Min Cheon, Seoul (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 16 days.

(21) Appl. No.: 13/395,277

(22) PCT Filed: Jul. 12, 2010

(86) PCT No.: PCT/KR2010/004512
§ 371 (c)(1),
(2), (4) Date: May 22, 2012

(87) PCT Pub. No.: WO2011/031003
PCT Pub. Date: Mar. 17, 2011

(65) Prior Publication Data
US 2012/0229204 A1 Sep. 13, 2012

(30) Foreign Application Priority Data

Sep. 10, 2009 (KR) .................. 10-2009-0085217

(51) Int. Cl.
H03F 1/02 (2006.01)
H03F 1/14 (2006.01)
H03K 17/00 (2006.01)
H03F 3/00 (2006.01)

(52) U.S. Cl.
CPC ..................... *H03F 3/005* (2013.01)
USPC ................. 330/9; 330/51; 327/124; 327/307

(58) Field of Classification Search
CPC ....................................... H03F 3/005
USPC ........................ 330/9, 51; 327/124
See application file for complete search history.

(56) References Cited

U.S. PATENT DOCUMENTS

| 5,703,589 | A | 12/1997 | Kalthoff et al. |
| 6,456,159 | B1 * | 9/2002 | Brewer ............... 330/9 |
| 6,639,460 | B1 * | 10/2003 | Botker ............... 330/9 |
| 7,038,532 | B1 | 5/2006 | Bocko et al. |
| 2007/0170981 | A1 | 7/2007 | Burt et al. |

FOREIGN PATENT DOCUMENTS

KR    10-0794310 B1    1/2008

OTHER PUBLICATIONS

International Search Report and Written Opinion for PCT/KR2010/004512, dated Feb. 22, 2011.

* cited by examiner

*Primary Examiner* — Robert Pascal
*Assistant Examiner* — Khiem Nguyen
(74) *Attorney, Agent, or Firm* — Rajesh Vallabh; Foley Hoag LLP

(57) ABSTRACT

According to the present invention, a switched capacitor circuit comprises: an inverting amplifier for removing the offset by using a chopper stabilization circuit; a sampling unit which is connected between an input terminal and the inverting amplifier; and a feedback unit which is connected to the inverting amplifier in parallel.

10 Claims, 6 Drawing Sheets

SWITCHED CAPACITOR CIRCUIT

TECHNICAL FIELD

The present invention relates to a semiconductor circuit, and more particularly, to a switched capacitor circuit.

BACKGROUND ART

In a semiconductor circuit, a switched capacitor circuit is widely used to improve a degree of integration and design a low power circuit. Performance of the switched capacitor circuit is being improved rapidly, along with a development of a complementary metal-oxide-semiconductor (CMOS) analog circuit technology.

The switched capacitor circuit is used for various analog circuits, for example, an integrator, an adder, an analog filter, an analog-to-digital converter (ADC), a digital-to-analog converter (DAC), and the like. An operational amplifier (OP-Amp.) is typically used as one of main blocks of the switched capacitor circuit. However, the OP-Amp. has issues in terms of high power consumption and occupying a large area. Accordingly, use of an inverting amplifier using a relatively lower amount of power in the switched capacitor circuit is increasing, in place of the OP-Amp.

DISCLOSURE OF INVENTION

Technical Goals

An aspect of the present invention provides a switched capacitor circuit that may reduce power consumption and an area occupied by the switched capacitor circuit while extending a range of applications of a semiconductor circuit.

Technical Solutions

According to an aspect of the present invention, there is provided a switched capacitor circuit, including an inverting amplifier to remove an offset using a chopper stabilization circuit, a sampling unit connected between an input terminal and the inverting amplifier, and a feedback unit connected to the inverting amplifier in parallel.

The inverting amplifier may include a pair of differential inverters, a first chopper stabilization circuit, connected to input terminals of the pair of differential inverters, to transmit an input signal to the pair of differential inverters by inverting the input signal periodically, and a second chopper stabilization circuit, connected to output terminals of the pair of the differential inverters, to transmit an output signal of the pair of differential inverters to the output terminals by inverting the output signal periodically.

The sampling unit may include a first pair of switches connected between the input terminals and a first pair of nodes, and to be turned ON in response to a first control signal being received, a second pair of switches connected between the first pair of nodes and a ground, and to be turned ON in response to a second control signal being received, a third pair of switches connected between a second pair of nodes and the ground, and to be turned ON in response to the first control signal being received, a fourth pair of switches connected between the second pair of nodes and a third pair of nodes, and to be turned ON in response to the second control signal being received, and a pair of sampling capacitors connected between the first pair of nodes and the second pair of nodes.

The feedback unit may include a pair of feedback capacitors.

The first chopper stabilization circuit may include a fifth pair of switches to enable a signal of the third pair of nodes to be transferred, in an original state, to the pair of differential inverters when the fifth pair of switches are turned ON in response to a first chopping signal being received, and a sixth pair of switches to enable the signal of the third pair of nodes to be inverted and transferred to the pair of differential inverters when the six pair of switches are turned ON in response to a second chopping signal being received.

The second chopper stabilization circuit may include a seventh pair of switches to enable an output signal of the pair of differential inverters to be transferred, in an original state, to the output terminals when the seventh pair of switches are turned ON in response to a third chopping signal being received, and an eighth pair of switches to enable the output signal of the pair of differential inverters to be inverted and transferred to the output terminals when the eighth pair of switches are turned ON in response to a fourth chopping signal being received.

The first chopping signal and the second chopping signal that control the first chopper stabilization circuit may correspond to non-overlapping two-phase clocks.

The third chopping signal and the fourth chopping signal that control the second chopper stabilization circuit may correspond to non-overlapping two-phase clocks.

The first chopping signal and the third chopping signal may correspond to clocks having different overlapping pulse durations.

The second chopping signal and the fourth chopping signal may correspond to clocks having different overlapping pulse durations.

The switched capacitor circuit may further include a plurality of sampling units connected to one another in parallel, a ninth pair of switches connected to one terminal of the pair of feedback capacitors, and to be turned ON in response to the second control signal being received, a tenth pair of switches connected between the one end of the pair of feedback capacitors and a ground, and to be turned ON in response to the first control signal being received, an eleventh pair of switches connected between another end of the pair of feedback capacitors and the ground, and to be turned ON in response to the first control signal being received, and a twelfth pair of switches connected to the other end of the pair of feedback capacitors, and to be turned ON in response to the second control signal being received.

The first control signal and the second control signal may correspond to non-overlapping two-phase clocks.

According to another aspect of the present invention, there is provided an inverting amplifier, including a pair of differential inverters, a first chopper stabilization circuit, connected to input terminals of the pair of differential inverters, to transmit an input signal to the pair of differential inverters by inverting the input signal periodically, and a second chopper stabilization circuit, connected to output terminals of the pair of the differential inverters, to transmit an output signal of the pair of differential inverters to the output terminals by inverting the output signal periodically.

The first chopper stabilization circuit may include a first pair of switches to enable an input signal to be transferred, in an original state, to output terminals of the first chopper stabilization circuit when the first pair of switches are turned ON in response to a first chopping signal being received, and a second pair of switches to enable the input signal to be inverted and transferred to the output terminals of the first chopper stabilization circuit when the second pair of switches are turned ON in response to a second chopping signal being received.

The second chopper stabilization circuit may include a third pair of switches to enable an input signal to be transferred, in an original state, to the output terminals when the third pair of switches are turned ON in response to a third chopping signal being received, and a fourth pair of switches to enable the input signal to be inverted and transferred to the output terminals when the fourth pair of switches are turned ON in response to a fourth chopping signal being received.

Advantageous Effects

According to the present invention, a switched capacitor circuit may reduce power consumption and an area occupied by the switched capacitor circuit while extending a range of applications of a semiconductor circuit, using an inverting amplifier including a chopper stabilization circuit to remove an offset and a flicker noise.

BEST MODE FOR CARRYING OUT THE INVENTION

Figure 1:
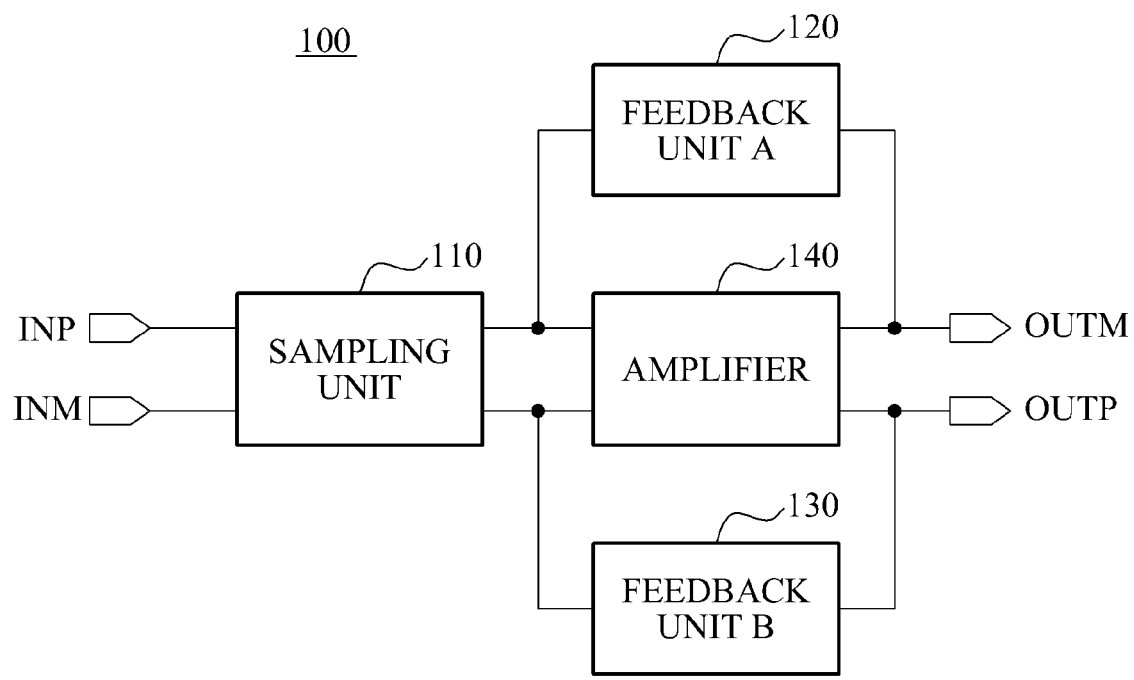
FIG. 1 is a block diagram illustrating a switched capacitor circuit 100 according to an embodiment of the present invention.

Reference will now be made in detail to embodiments of the present invention, examples of which are illustrated in the accompanying drawings, wherein like reference numerals refer to the like elements throughout. The embodiments are described below in order to explain the present invention by referring to the figures.

FIG. 1 is a block diagram illustrating a switched capacitor circuit 100 according to an embodiment of the present invention. Referring to FIG. 1, the switched capacitor circuit 100 may include a sampling unit 110, feedback units 120 and 130, and an amplifier 140.

The switched capacitor circuit 100 may perform a function of an integrator or an adder, through a sampling mode and an integration mode. An input voltage may be charged to the sampling unit 110 in the sampling mode. When the sampling unit 110 is completely charged, the input voltage may be referred to as being sampled to the sampling unit 110. An electric charge charged to the sampling unit 110 may be transferred to the feedback units 120 and 130, in the integration mode.

The sampling unit 110 may be connected between input terminals INP and INM and the amplifier 140. The feedback units 120 and 130, and the amplifier 140 may be connected between the sampling unit 100 and output terminals OUTP and OUTM in parallel. The sampling unit 110 may charge an electric charge using an input voltage applied to the input terminals INP and INM in the sampling mode. Also, the sampling unit 110 may transfer, to the feedback units 120 and 130, the electric charge charged to the sampling unit 110, in the integration mode. The aforementioned process may be performed by a feedback loop that may be formed by the feedback units 120 and 130, and the amplifier 140. An operational process of the switched capacitor circuit 100 will be further described hereinafter.

Figure 2:
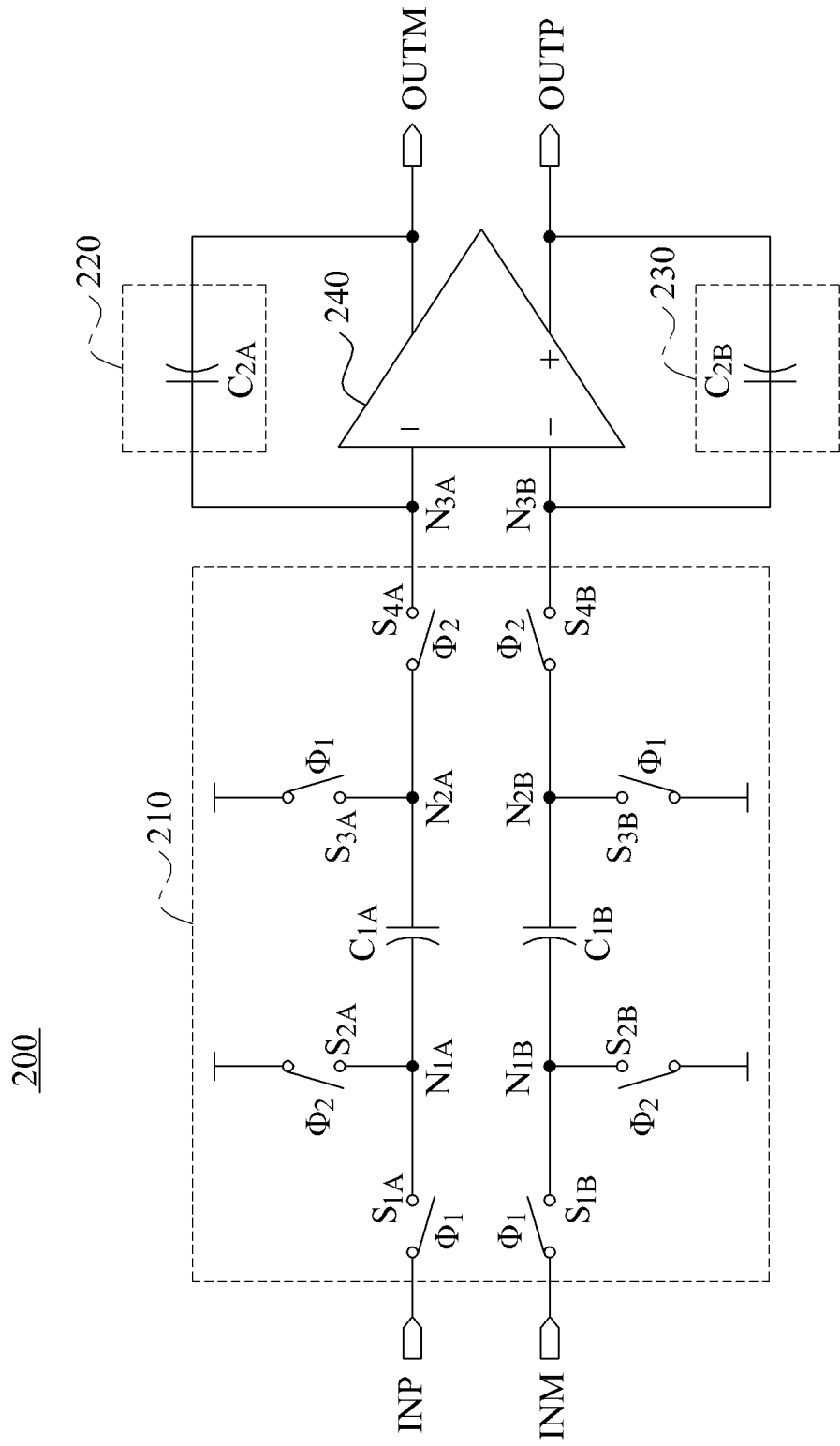
FIG. 2 is a circuit diagram illustrating an example of the switched capacitor circuit 100 of FIG. 1.

FIG. 2 is a circuit diagram illustrating an example of the switched capacitor circuit 100 of FIG. 1. Referring to FIG. 2, a switched capacitor circuit 200 may include a sampling unit 210, feedback units 220 and 230, and an operational amplifier 240.

The sampling unit 210 may be connected between input terminals INP and INM and the operational amplifier 240. The feedback units 220 and 230, and the operational amplifier 240 may be connected, between the sampling unit 210 and output terminals OUTP and OUTM, in parallel.

The sampling unit 210 may include a pair of switches $S_{1A}$ and $S_{1B}$, a pair of switches $S_{2A}$ and $S_{2B}$, a pair of switches $S_{3A}$ and $S_{3B}$, a pair of switches $S_{4A}$ and $S_{4B}$, and a pair of capacitors $C_{1A}$ and $C_{1B}$. The pair of switches $S_{1A}$ and $S_{1B}$ may be connected between the input terminals INP and INM and a pair of nodes $N_{1A}$ and $N_{1B}$, respectively. The pair of switches $S_{2A}$ and $S_{2B}$ may be connected between the pair of nodes $N_{1A}$ and $N_{1B}$ and grounds, respectively. The pair of switches $S_{3A}$ and $S_{3B}$ may be connected between a pair of nodes $N_{2A}$ and $N_{2B}$ and grounds, respectively. The pair of switches $S_{4A}$ and $S_{4B}$ may be connected between the pair of nodes $N_{2A}$ and $N_{2B}$ and a pair of nodes $N_{3A}$ and $N_{3B}$, respectively. The pair of capacitors $C_{1A}$ and $C_{1B}$ may be connected between the pair of nodes $N_{1A}$ and $N_{1B}$ and the pair of nodes $N_{2A}$ and $N_{2B}$. The feedback units 220 and 230 may correspond to a pair of capacitors $C_{2A}$ and $C_{2B}$.

The pair of switches $S_{1A}$ and $S_{1B}$ and the pair of switches $S_{3A}$ and $S_{3B}$ may be turned ON, and the pair of switches $S_{2A}$ and $S_{2B}$ and the pair of switches $S_{4A}$ and $S_{4B}$ may be turned OFF, in response to a first control signal $\Phi_1$ being received in a sampling mode. Simultaneously, the sampling unit 210 may charge an electric charge to the pair of capacitors $C_{1A}$ and $C_{1B}$, using an input voltage applied to the input terminals INP and INM. Conversely, the pair of switches $S_{1A}$ and $S_{1B}$ and the pair of switches $S_{3A}$ and $S_{3B}$ may be turned OFF, and the pair of switches $S_{2A}$ and $S_{2B}$ and the pair of switches $S_{4A}$ and $S_{4B}$ may be turned ON, in response to a second control signal $\Phi_2$ being received in an integration mode. Simultaneously, the electric charge charged to the pair of capacitors $C_{1A}$ and $C_{1B}$ may be transferred to the pair of capacitors $C_{2A}$ and $C_{2B}$. The aforementioned process may be performed by a feedback loop formed by the pair of capacitors $C_{2A}$ and $C_{2B}$, and the operational amplifier 240. The switched capacitor circuit 200 may be operated as an integrator by repeating the sampling mode and the integration mode.

Figure 3:
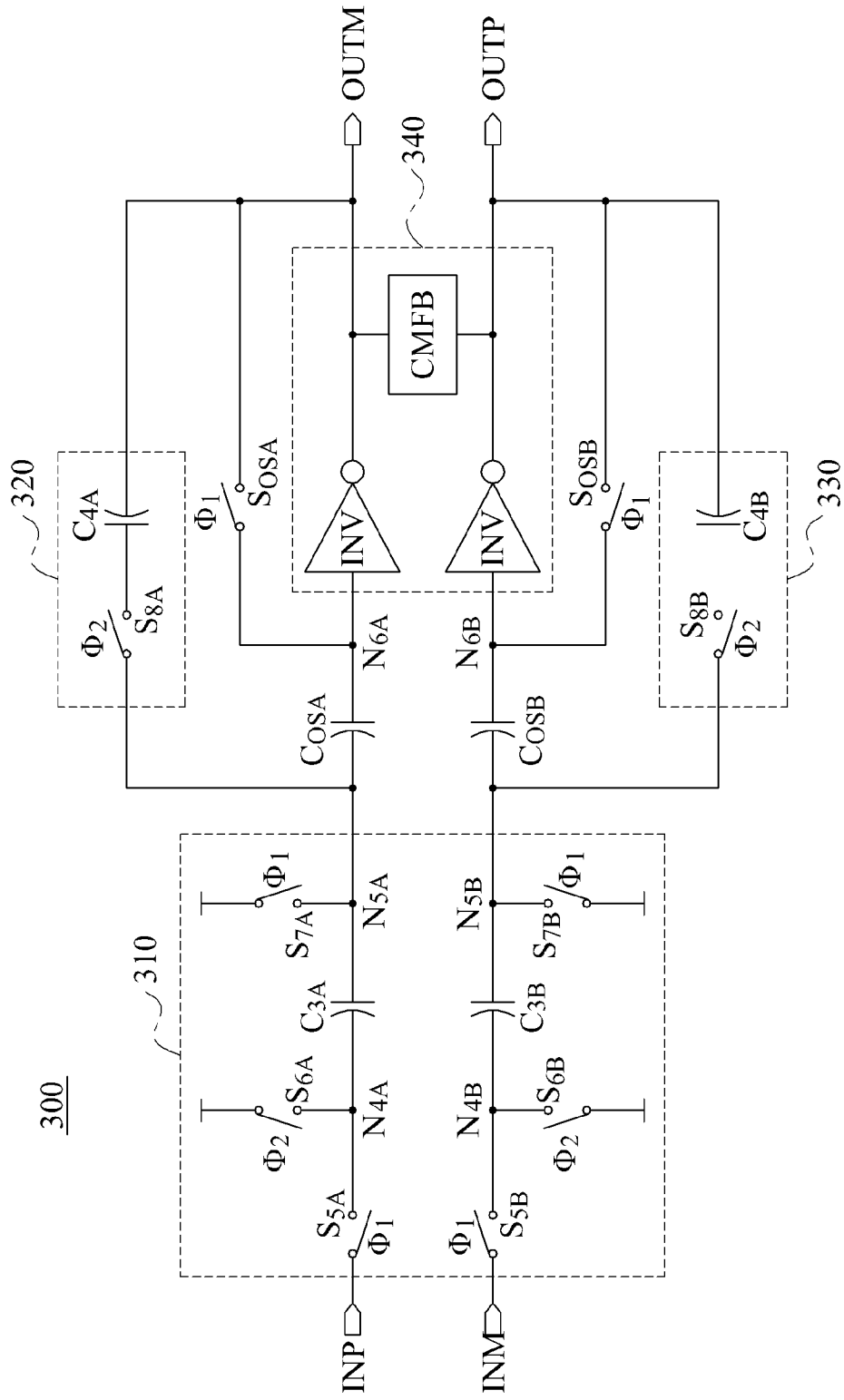
FIG. 3 is a circuit diagram illustrating another example of the switched capacitor circuit 100 of FIG. 1.

FIG. 3 is a circuit diagram illustrating another example of the switched capacitor circuit 100 of FIG. 1. Referring to FIG. 3, a switched capacitor circuit 300 may include a sampling unit 310, feedback units 320 and 330, an inverting amplifier 340, a pair of offset switches $S_{OSA}$ and $S_{OSB}$, and a pair of offset capacitors $C_{OSA}$ and $C_{OSB}$.

The sampling unit 310 may be connected between input terminals INP and INM and the pair of offset capacitors $C_{OSA}$ and $C_{OSB}$. The feedback units 320 and 330 may be connected between the sampling unit 310 and output terminals OUTP and OUTM. The pair of offset capacitors $C_{OSA}$ and $C_{OSB}$ may be connected between the sampling unit 310 and the inverting amplifier 340. The inverting amplifier 340 and the pair of offset switches $S_{OSA}$ and $S_{OSB}$ may be connected between the pair of offset capacitors $C_{OSA}$ and $C_{OSB}$ and the output terminals OUTP and OUTM in parallel, respectively.

The sampling unit 310 may include a pair of switches $S_{5A}$ and $S_{5B}$, a pair of switches $S_{6A}$ and $S_{6B}$, a pair of switches $S_{7A}$ and $S_{7B}$, and a pair of capacitors $C_{3A}$ and $C_{3B}$. The pair of switches $S_{5A}$ and $S_{5B}$ may be connected between the input terminals INP and INM and a pair of nodes $N_{4A}$ and $N_{4B}$, respectively. The pair of switches $S_{6A}$ and $S_{6B}$ may be connected between a pair of nodes $N_{5A}$ and $N_{5B}$ and grounds, respectively. The pair of switches $S_{7A}$ and $S_{7B}$ may be connected between the pair of nodes $N_{5A}$ and $N_{5B}$ and grounds, respectively. The pair of capacitors $C_{3A}$ and $C_{3B}$ may be connected between the pair of nodes $N_{4A}$ and $N_{4B}$ and the pair of nodes $N_{5A}$ and $N_{5B}$, respectively. The feedback units 320 and 330 may include a pair of switches $S_{8A}$ and $S_{8B}$ and a pair of capacitors $C_{4A}$ and $C_{4B}$. The pair of switches $S_{8A}$ and $S_{8B}$ may be connected to the pair of capacitors $C_{4A}$ and $C_{4B}$, respectively. The inverting amplifier 340 may include a pair of inverters (INVs) and a common mode feedback circuit (CMFB). The CMFB may be connected between the output terminals OUPT and OUTM. Here, the CMFB may stabilize an output signal of a differential switched capacitor circuit.

The pair of offset switches $S_{OSA}$ and $S_{OSB}$ may be turned ON in response to a first control signal $\Phi_1$ being received in a sampling mode. Simultaneously, an input and an output of the pair of INVs may be shorted. An electric charge corresponding to an offset voltage of the pair of INVs may be charged to the pair of offset capacitors $C_{OSA}$ and $C_{OSB}$. The offset voltage at the pair of offset capacitors $C_{OSA}$ and $C_{OSB}$ may be maintained in an original state since the pair of INVs may be open internally although the mode is changed to an integration mode. Here, the operation in the sampling mode and the operation in the integration mode, excluding the operation of charging and maintaining the offset voltage, may be substantially identical to the operations of the switched capacitor circuit 200 of FIG. 2 and thus, duplicated descriptions will be omitted for conciseness. The switched capacitor circuit 300 may reduce power consumption and a circuit area considerably, using the inverting amplifier 340 instead of the operational amplifier 240.

Figure 4:
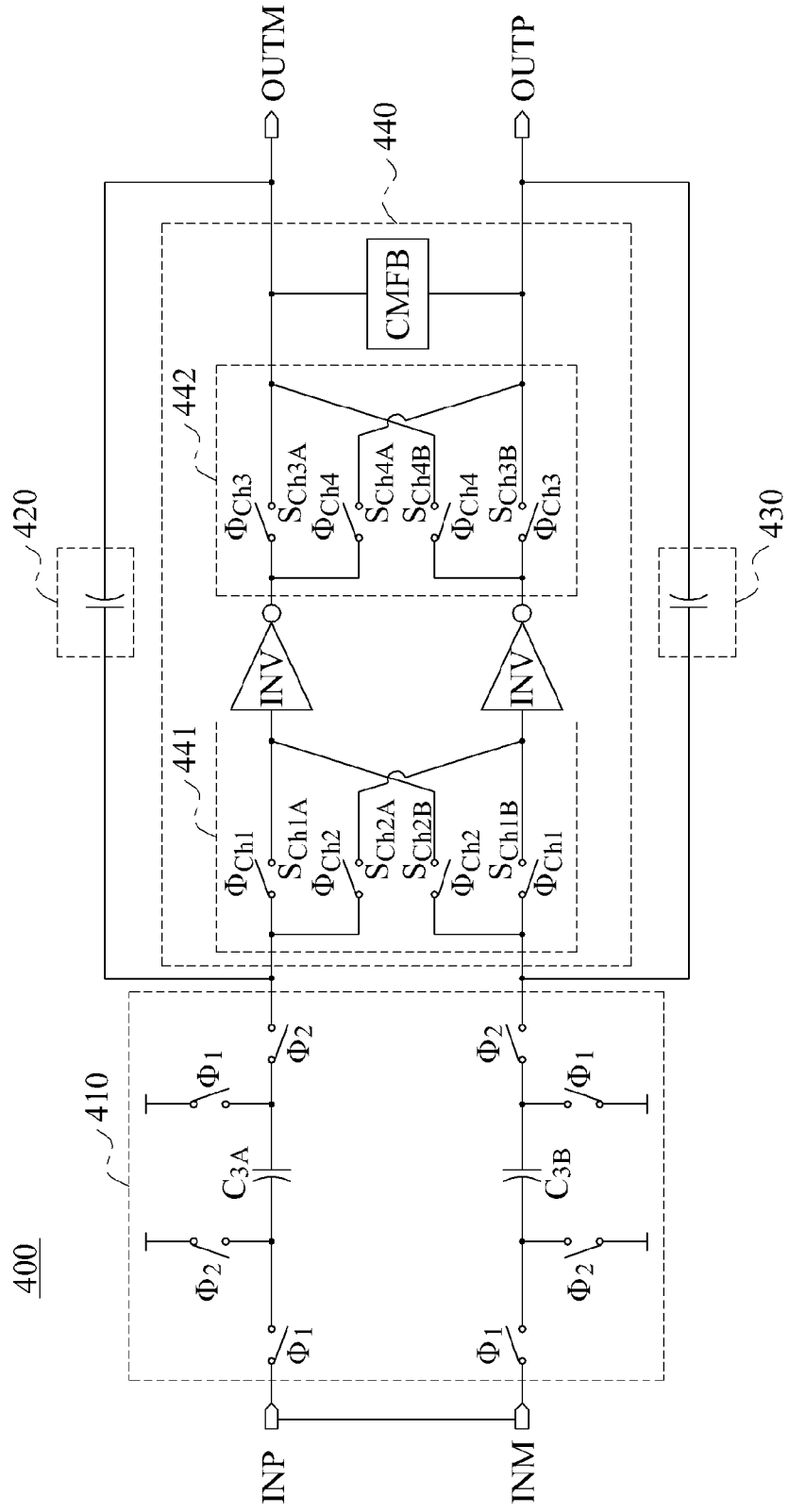
FIG. 4 is a circuit diagram illustrating still another example of the switched capacitor circuit 100 of FIG. 1.

FIG. 4 is a circuit diagram illustrating still another example of the switched capacitor circuit 100 of FIG. 1. Referring to FIG. 4, a switched capacitor circuit 400 may include a sampling unit 410, feedback units 420 and 430, and an inverting amplifier 440. Here, the inverting amplifier 440 may include a first chopper stabilization circuit 441 and a second chopper stabilization circuit 442. The first chopper stabilization circuit 441 and the second chopper stabilization circuit 442 may enable the inverting amplifier 440 to amplify a signal stably, without using a pair of offset capacitors $C_{OSA}$ and $C_{OSB}$. When the first chopper stabilization circuit 441 and the second chopper stabilization circuit 442 are used, the pair of offset capacitors $C_{OSA}$ and $C_{OSB}$ may be removed from the switched capacitor circuit 300 of FIG. 3.

Accordingly, power consumption and an area occupied by the switched capacitor circuit 300 may be further reduced.

The sampling unit 410 and the feedback units 420 and 430 of FIG. 4 are configured to be substantially identical to the sampling unit 210 and the feedback units 220 and 230 of FIG. 2 and thus, duplicated descriptions will be omitted for conciseness.

The inverting amplifier 440 having a chopper stabilization function may include a pair of inverters (INVs), a common mode feedback circuit (CMFB), the first chopper stabilization circuit 441, and the second chopper stabilization circuit 442. The first chopper stabilization circuit 441 may be connected between the sampling unit 410 and the pair of INVs. The second chopper stabilization circuit 442 may be connected between the pair of INVs and output terminals OUTP and OUTM. The CMFB may be connected between the output terminals OUTP and OUTM. Here, the CMFB may stabilize an output signal of a differential switched capacitor circuit.

The first chopper stabilization circuit 441 may include a pair of switches $S_{CH1A}$ and $S_{CH1B}$ and a pair of switches $S_{CH2A}$ and $S_{CH2B}$. When the pair of switches $S_{CH1A}$ and $S_{CH1B}$, which may be turned ON in response to a first chopping signal $\Phi_{Ch1}$ being received, are turned ON, an input signal may be configured to be transferred, in an original state, to an output terminal of the first chopper stabilization circuit 441. When the pair of switches $S_{CH2A}$ and $S_{CH2B}$, which may be turned ON in response to a second chopping signal $\Phi_{Ch2}$ being received, are turned ON, the input signal may be configured to be inverted and transferred to the output terminal of the first shopper stabilization circuit 441. The second chopper stabilization circuit 442 may include a pair of switches $S_{CH3A}$ and $S_{CH3B}$ and a pair of switches $S_{CH4A}$ and $S_{CH4B}$. When the pair of switches $S_{CH3A}$ and $S_{CH3B}$, which may be turned ON in response to a third chopping signal $\Phi_{Ch3}$ being received, are turned ON, an input signal may be configured to be transferred, in an original state, to an output terminal. When the pair of switches $S_{CH4A}$ and $S_{CH4B}$, which may be turned ON in response to a fourth chopping signal $\Phi_{Ch4}$ being received, are turned ON, the input signal may be configured to be inverted and transferred to the output terminal.

The first chopper stabilization circuit 441 may transfer, to the pair of INVs, a signal input to the inverting amplifier 440, by inverting the input signal periodically, in an integration mode. The second chopper stabilization circuit 442 may transfer, to the output terminal OUTP and OUTM, a signal output from the pair of INVs by inverting the output signal periodically, in an integration mode.

Generally, an amplification noise may be generated when an unnecessary direct current (DC) signal is amplified by an amplifier having a high gain. The unnecessary DC signal may be generated by a difference in a voltage, that is, an offset, between an input and an output of the amplifier. In the switched capacitor circuit 300 of FIG. 3, in order to remove the offset, an offset voltage may be maintained by the pair of offset capacitors $C_{OSA}$ and $C_{OSB}$ so that a difference in a DC voltage between an input and an output of an amplifier may become identical.

Conversely, the first chopper stabilization circuit 441 and the second chopper stabilization circuit 442 may temporally convert the DC signal to an alternating current (AC) signal, whereby an unnecessary DC signal may be prevented from being amplified. Also, the first chopper stabilization circuit 441 and the second chopper stabilization circuit 442 may remove a flicker noise. By replacing an amplifier with the inverting amplifier 440 including a chopper stabilization circuit, the switched capacitor circuit 200 of FIG. 2 and the switched capacitor circuit 400 of FIG. 4 may perform substantially identical operations through a functional block unit, that is, an integrator.

Figure 5:
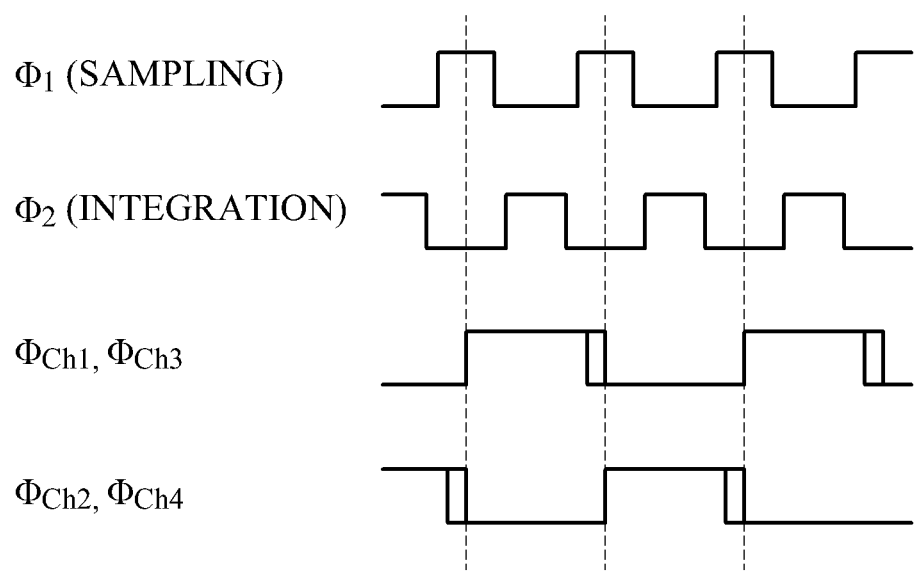
FIG. 5 is a diagram illustrating a signal waveform used in a switched capacitor circuit 400 of FIG. 4.

FIG. 5 is a diagram illustrating a signal waveform used in the switched capacitor circuit 400 of FIG. 4. Referring to FIG. 5, a first control signal $\Phi_1$ and a second control signal $\Phi_2$ may correspond to non-overlapping two-phase clocks. The first chopping signal $\Phi_{Ch1}$ and the second chopping signal $\Phi_{Ch2}$ that may control the first chopper stabilization circuit 441 may correspond to non-overlapping two-phase clocks. The third chopping signal $\Phi_{Ch3}$ and the fourth chopping signal $\Phi_{Ch4}$ that may control the second chopper stabilization circuit 442 may correspond to non-overlapping two-phase clocks. Also, the first chopping signal $\Phi_{Ch1}$ and the third chopping signal $\Phi_{Ch3}$ may correspond to clocks having different overlapping pulse durations. The second chopping signal $\Phi_{Ch2}$ and the fourth chopping signal $\Phi_{Ch4}$ may correspond to clocks having different overlapping pulse durations.

The first chopping signal $\Phi_{Ch1}$, the second chopping signal $\Phi_{Ch2}$, the third chopping signal $\Phi_{Ch3}$, and the fourth shopping signal $\Phi_{Ch4}$ may be inverted from a high electrical potential to a low electrical potential, or from a low electrical potential to a high electrical potential, in a sampling mode, in order to switch connection states of the first chopping stabilization circuit 441 and the second chopping stabilization circuit 442 in an integration mode. Accordingly, when a chopping signal corresponds to a high electrical potential or a low electrical potential in a current integration mode, a pattern in which the chopping signal may be inverted to a low electrical potential or a high electrical potential in a subsequent integration mode may be maintained.

Figure 6:
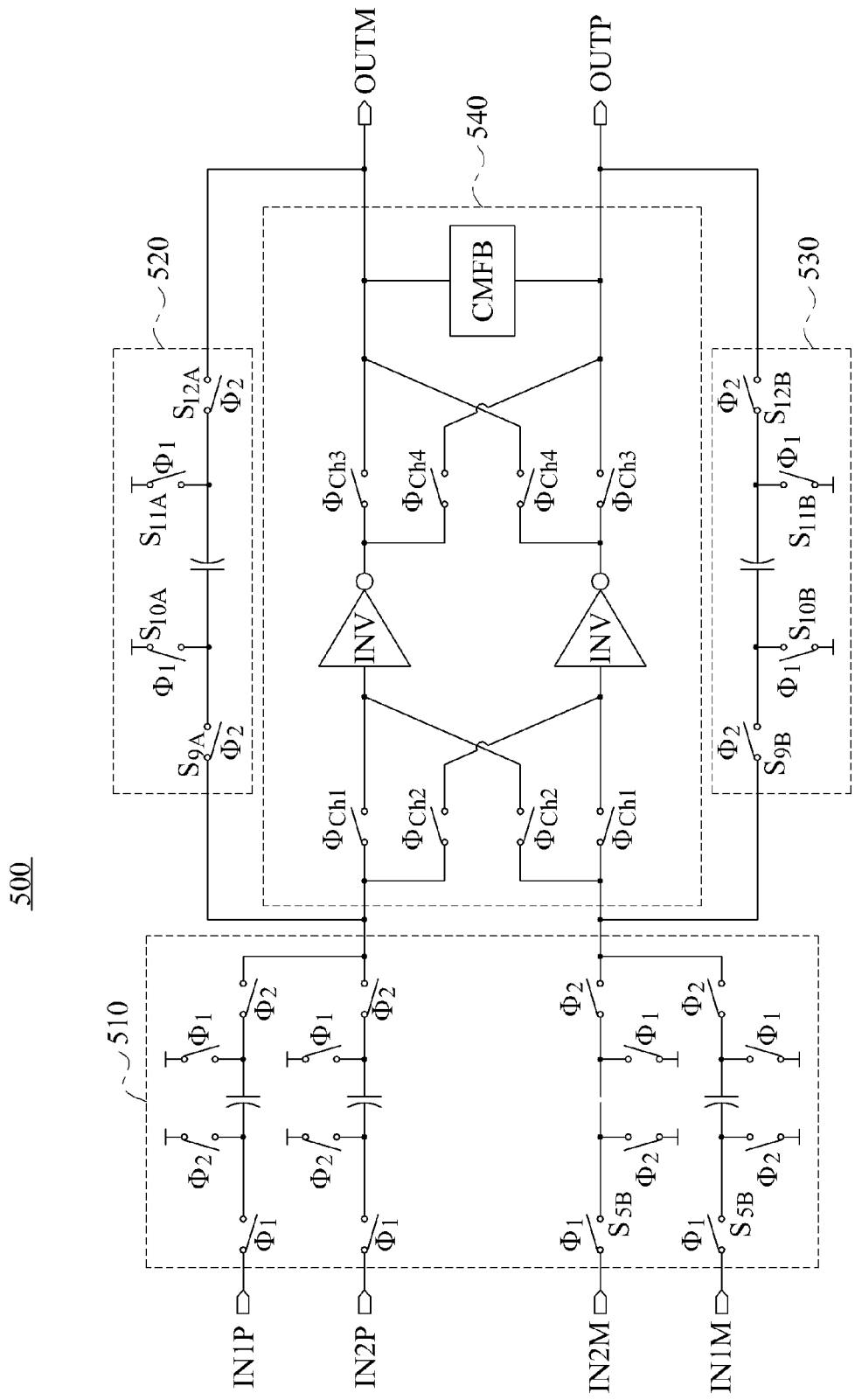
FIG. 6 is a circuit diagram illustrating yet another example of the switched capacitor circuit 100 of FIG. 1.

FIG. 6 is a circuit diagram illustrating yet another example of the switched capacitor circuit 100 of FIG. 1. Referring to FIG. 6, a switched capacitor circuit 500 may include a sampling unit 510, feedback units 520 and 530, and an inverting amplifier 540. Here, the inverting amplifier 540 may have a configuration substantially identical to a structure of the inverting amplifier 440 of FIG. 4. Accordingly, a pair of offset capacitors $C_{OSA}$ and $C_{OSB}$ used to remove an amplification noise may be removed.

The switched capacitor circuit 500 may have a basic structure similar to a structure of the switched capacitor circuit 400 of FIG. 4. The switched capacitor circuit 500 may be different from the switched capacitor circuit 400 in that the sampling unit 510 may include two of the sampling units 410 of FIG. 4. Accordingly, the switched capacitor circuit 500 may perform a function of an adder that may sum respective input voltages applied to first input terminals IN1P and IN1M and second input terminals IN2P and IN2M. Here, a more number of the sampling units 410 may be included in order to realize an adder for a more amount of input voltage.

The feedback units 520 and 530 may be connected between terminals of feedback capacitors and grounds, respectively. The feedback units 520 and 530 may include a pair of switches $S_{10A}$ and $S_{10B}$ and a pair of switches $S_{11A}$ and $S_{11B}$ that may be turned ON in response to a first control signal $\Phi_1$ being received, and a pair of switches $S_{9A}$ and $S_{9B}$ and a pair of switches $S_{12A}$ and $S_{12B}$ that may be turned ON in response to a second control signal $\Phi_2$ being received. When the pair of switches $S_{10A}$ and $S_{10B}$ and the pair of switches $S_{11A}$ and $S_{11B}$ are turned ON in a sampling mode, an electric charge charged to the feedback units 520 and 530 may be discharged. Accordingly, the switched capacitor circuit 500 may prevent input voltages from being accumulated to be summed.

A switched capacitor circuit according to an embodiment of the present invention may be varied and applied in various forms. For example, the switched capacitor circuit may be used for a sigma-delta modulator that may become a low-pass filter with respect to an input voltage, and may become a high-pass filter with respect to a noise; a correlated-double sampling (CDS) amplifier of an image photographing apparatus; a pseudo differential integrator, or the like.

Although a few embodiments of the present invention have been shown and described, the present invention is not limited to the described embodiments. Instead, it would be appreciated by those skilled in the art that changes may be made to these embodiments without departing from the principles and spirit of the invention, the scope of which is defined by the claims and their equivalents.

The invention claimed is:

1. A switched capacitor circuit, comprising:
    an inverting amplifier to remove an offset using a chopper stabilization circuit;
    a sampling unit connected between an input terminal and the inverting amplifier; and
    a feedback unit connected to the inverting amplifier in parallel,
    wherein the inverting amplifier comprises:
        a pair of differential inverters;
        a first chopper stabilization circuit, connected to input terminals of the pair of differential inverters, to transmit an input signal to the pair of differential inverters by inverting the input signal periodically; and
        a second chopper stabilization circuit, connected to output terminals of the pair of the differential inverters, to transmit an output signal of the pair of differential inverters to the output terminals by inverting the output signal periodically,
    wherein the sampling unit comprises:
        a first pair of switches connected between the input terminals and a first pair of nodes, and to be turned ON in response to a first control signal being received;
        a second pair of switches connected between the first pair of nodes and a ground, and to be turned ON in response to a second control signal being received;
        a third pair of switches connected between a second pair of nodes and the ground, and to be turned ON in response to the first control signal being received;
        a fourth pair of switches connected between the second pair of nodes and a third pair of nodes, and to be turned ON in response to the second control signal being received; and
        a pair of sampling capacitors connected between the first pair of nodes and the second pair of nodes.

2. The switched capacitor circuit of claim 1, wherein the feedback unit comprises a pair of feedback capacitors.

3. The switched capacitor circuit of claim 2, wherein the first chopper stabilization circuit comprises:
    a fifth pair of switches to enable a signal of the third pair of nodes to be transferred, in an original state, to the pair of differential inverters when the fifth pair of switches are turned ON in response to a first chopping signal being received; and
    a sixth pair of switches to enable the signal of the third pair of nodes to be inverted and transferred to the pair of differential inverters when the six pair of switches are turned ON in response to a second chopping signal being received.

4. The switched capacitor circuit of claim 3, wherein the second chopper stabilization circuit comprises:
    a seventh pair of switches to enable an output signal of the pair of differential inverters to be transferred, in an original state, to the output terminals when the seventh pair of switches are turned ON in response to a third chopping signal being received; and
    an eighth pair of switches to enable the output signal of the pair of differential inverters to be inverted and transferred to the output terminals when the eighth pair of switches are turned ON in response to a fourth chopping signal being received.

5. The switched capacitor circuit of claim 4, wherein the first chopping signal and the second chopping signal that control the first chopper stabilization circuit correspond to non-overlapping two-phase clocks.

6. The switched capacitor circuit of claim 5, wherein the third chopping signal and the fourth chopping signal that control the second chopper stabilization circuit correspond to non-overlapping two-phase clocks.

7. The switched capacitor circuit of claim 6, wherein the first chopping signal and the third chopping signal correspond to clocks having different overlapping pulse durations.

8. The switched capacitor circuit of claim 7, wherein the second chopping signal and the fourth chopping signal correspond to clocks having different overlapping pulse durations.

9. The switched capacitor circuit of claim 4, further comprising:
   a plurality of sampling units connected to one another in parallel;
   a ninth pair of switches connected to one terminal of the pair of feedback capacitors, and to be turned ON in response to the second control signal being received;
   a tenth pair of switches connected between the one end of the pair of feedback capacitors and a ground, and to be turned ON in response to the first control signal being received;
   an eleventh pair of switches connected between another end of the pair of feedback capacitors and the ground, and to be turned ON in response to the first control signal being received; and
   a twelfth pair of switches connected to the other end of the pair of feedback capacitors, and to be turned ON in response to the second control signal being received.

10. The switched capacitor circuit of claim 9, wherein the first control signal and the second control signal correspond to non-overlapping two-phase clocks.

\* \* \* \* \*